(12) United States Patent
Tabuchi (10) Patent No.: US 9,425,024 B2
(45) Date of Patent: Aug. 23, 2016

(54) LOAD SIMULATOR

(75) Inventor: Isao Tabuchi, Osaka (JP)

(73) Assignee: DAIHEN Corporation, Osaka (JP)

( * ) Notice: Subject to any disclaimer, the term of this patent is extended or adjusted under 35 U.S.C. 154(b) by 188 days.

(21) Appl. No.: 13/429,701

(22) Filed: Mar. 26, 2012

(65) Prior Publication Data

US 2012/0249161 A1 Oct. 4, 2012

(30) Foreign Application Priority Data

Mar. 30, 2011 (JP) ................................ 2011-074539

(51) Int. Cl.
| | | |
|---|---|---|
| G01P 3/54 | (2006.01) | |
| G01P 3/66 | (2006.01) | |
| H01J 37/32 | (2006.01) | |
| G01R 27/28 | (2006.01) | |

(52) U.S. Cl.
CPC .... *H01J 37/32091* (2013.01); *H01J 37/32935* (2013.01); *G01R 27/28* (2013.01)

(58) Field of Classification Search
CPC .................... H01J 37/32935; H01J 37/92091; G01R 27/28
USPC .......................................... 324/601, 173–178
See application file for complete search history.

(56) References Cited

U.S. PATENT DOCUMENTS

| | | | | |
|---|---|---|---|---|
| 1,684,917 | A * | 9/1928 | Hammarlund | ................. 361/290 |
| 6,376,939 | B1 * | 4/2002 | Suzuki et al. | ................. 307/326 |
| 7,797,048 | B2 * | 9/2010 | Stevenson et al. | ............. 607/37 |
| 2002/0055677 | A1 * | 5/2002 | Kim | ........................ A61B 5/055 600/422 |
| 2004/0210407 | A1 * | 10/2004 | Quon | ................. H01J 37/32082 702/65 |
| 2005/0132806 | A1 * | 6/2005 | Lee et al. | .................... 73/514.32 |
| 2008/0197723 | A1 * | 8/2008 | Ichihara | ............... H02K 11/026 310/51 |
| 2009/0021884 | A1 * | 1/2009 | Nakamura | ..................... 361/233 |
| 2010/0129272 | A1 * | 5/2010 | Fujita et al. | ............. 422/186.29 |
| 2011/0079896 | A1 * | 4/2011 | Satoh et al. | .................. 257/737 |

FOREIGN PATENT DOCUMENTS

| | | |
|---|---|---|
| JP | 2004-309132 | 11/2004 |
| JP | 2007-163308 | 6/2007 |

* cited by examiner

*Primary Examiner* — Benjamin M Baldridge
*Assistant Examiner* — Farhana Hoque
(74) *Attorney, Agent, or Firm* — Hamre, Schumann, Mueller & Larson, P.C.

(57) ABSTRACT

A load simulator includes a passive element, two electrode plates that are connected to the passive element, and a bias applier. The bias applier is a coil spring, for example, and is provided between the two electrode plates. The bias applier biases at least one of the two electrode plates in a predetermined direction. The two electrode plates are disposed so as to be substantially parallel with each other, for example, and the bias applier biases the two electrode plates in the direction of separation from each other.

9 Claims, 4 Drawing Sheets

LOAD SIMULATOR

BACKGROUND OF THE INVENTION

1. Field of the Invention

The present invention relates to a load simulator used in a plasma processing system or the like.

2. Description of Related Art

Figure 8:
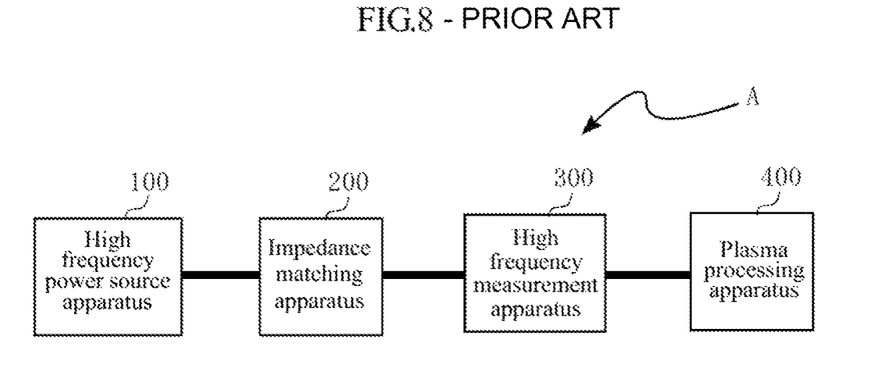
FIG. 8 is a block diagram showing the configuration of a general plasma processing system.

Recent years have seen the development of a plasma processing system in which a workpiece such as a semiconductor wafer or a liquid crystal substrate is processed using a method such as etching. FIG. 8 is a block diagram showing the configuration of a general plasma processing system. The plasma processing system shown in FIG. 8 includes a high frequency power source apparatus 100, an impedance matching apparatus 200, a high frequency measurement apparatus 300, and a plasma processing apparatus 400. The high frequency power source apparatus 100 outputs high frequency power, which is supplied to the plasma processing apparatus 400.

The high frequency measurement apparatus 300 monitors the impedance and the like of the plasma processing apparatus 400 during plasma processing. The high frequency measurement apparatus 300 is connected to an input terminal of the plasma processing apparatus 400 and includes sensors for detecting the high frequency voltage and the high frequency current at the input terminal. The high frequency measurement apparatus 300 also calculates various types of high frequency parameters for the impedance and the like based on the detected values of the high frequency voltage and the high frequency current.

In general, with high frequency measurement apparatuses, the detected values obtained by the sensors can deviate from correct values due to errors in the sensor sensitivity and the like. In light of this, a measurement object serving as a reference is measured by the measurement apparatus in advance, and a calibration parameter is acquired based on the measurement results.

In actual measurement, the detected values obtained by the sensors are converted into correct values using the calibration parameter, and the converted values are output (e.g., see JP 2004-309132A and JP 2007-163308A).

Figure 9:
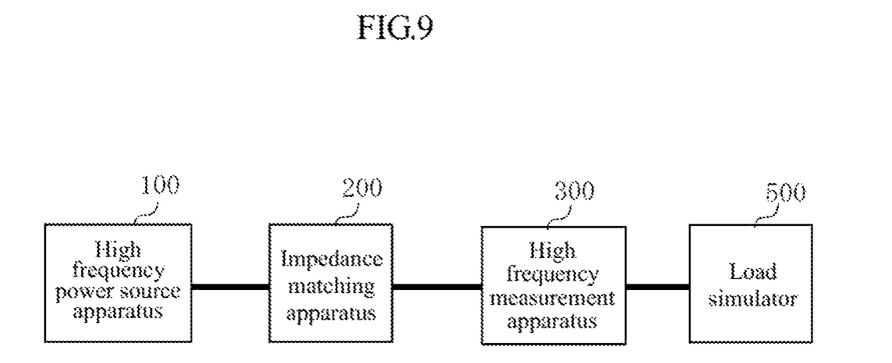
FIG. 9 is a diagram illustrating the case of using a conventional load simulator in processing for calibrating a high frequency measurement apparatus.

With the high frequency measurement apparatus 300 shown in FIG. 8, SOLT (Short-Open-Load-Thru) calibration, for example, is used for correction of the high frequency voltage and the high frequency current. In SOLT calibration, a load simulator (dummy load) 500 (see FIG. 9) for which the real impedance value has been specified in advance is connected to the high frequency measurement apparatus 300, and impedance measurement is performed by the high frequency measurement apparatus 300. Three types of load simulators having mutually different impedances are used when performing this measurement. Specifically, the load simulators that are used are a load simulator having the characteristic impedance of the measurement system (the characteristic impedance of the transmission line that transmits a high frequency for measurement, which is generally 50Ω or 75Ω), a load simulator having the open condition impedance (substantially infinite), and a load simulator having the short circuit condition impedance (substantially zero). Next, a calibration parameter for correcting the high frequency voltage and the high frequency current is calculated from the measured impedance values of the load simulators that were measured by the high frequency measurement apparatus 300 and the real impedance values of the load simulators, and the calibration parameter is recorded in a memory of the high frequency measurement apparatus 300.

In the actual measurement, the detected high frequency voltage and high frequency current are corrected using the calibration parameter recorded in the memory, and various types of high frequency parameters are calculated based on the corrected values.

With the calibration method described above, the high frequency measurement apparatus 300 is directly connected to each of the load simulators 500 when the calibration parameter is calculated. The calibration parameter is therefore for correcting the values at the output terminal of the high frequency measurement apparatus 300. The impedance that is corrected based on such a calibration parameter is the impedance obtained when the load side is viewed from the output terminal of the high frequency measurement apparatus 300. However, monitoring the plasma processing apparatus 400 requires measurement of the impedance between electrodes provided inside the chamber of the plasma processing apparatus 400.

In the case where the high frequency measurement apparatus 300 and the plasma processing apparatus 400 are directly connected to each other as shown in FIG. 8, the impedance obtained when the load side is viewed from the output terminal of the high frequency measurement apparatus 300 can be thought to correspond to the impedance between the electrodes in the plasma processing apparatus 400. However, the precision of the measured value obtained by the high frequency measurement apparatus 300 decreases since these two impedances are not completely the same.

SUMMARY OF THE INVENTION

The present invention was conceived in light of the above-described circumstances, and an object thereof is to provide a load simulator used for performing calibration so as to raise the precision of measured values obtained by a high frequency measurement apparatus as high as possible.

A load simulator provided by a first aspect of the present invention includes: a passive element; two electrode plates that are connected to the passive element; and a bias applier that biases at least one of the two electrode plates in a predetermined direction.

It is preferable that the two electrode plates are substantially parallel with each other, and the bias applier biases the two electrode plates in a direction of separation from each other.

It is preferable that the bias applier biases the two electrode plates so as to respectively be pressed against two electrodes in a chamber of a plasma processing apparatus.

It is preferable that the bias applier is a coil spring disposed between the two electrode plates.

It is preferable that the load simulator of the present invention further includes: a circuit having wiring that connects the passive element and the two electrode plates; and an insulator. The passive element and the circuit are disposed between the two electrode plates, and the insulator is disposed so as to surround the circuit.

It is preferable that the two electrode plates are each a copper plate.

It is preferable that the load simulator of the present invention further includes a flexible conductor for electrically connecting the passive element and at least one of the two electrode plates.

It is preferable that the conductor is copper foil.

It is preferable that the load simulator of the present invention further includes a coaxial connector electrically connected to the two electrode plates.

According to the present invention, at least one of the electrode plates is biased by the bias applier, thus enabling the electrode plate to be pressed in the predetermined direction. The load simulator of the present invention can be used when disposed between two electrodes in the chamber of a plasma processing apparatus. Accordingly, in a case such as the case of calibrating a high frequency measurement apparatus to be disposed at the input terminal of the plasma processing apparatus, it is possible to dispose the load simulator of the present invention between the two electrodes of the plasma processing apparatus, determine the impedance using the high frequency measurement apparatus, and then calculate a calibration parameter based on the measured impedance value obtained through the measurement and the real impedance value of the load simulator. The calibration parameter can be used to correct a detected value obtained by the high frequency measurement apparatus to the value between the electrodes of the plasma processing apparatus. Using this calibration parameter therefore enables raising the precision of the measured value obtained by the high frequency measurement apparatus.

Also, since the electrode plate is pressed against an electrode of the plasma processing apparatus by the bias applier, the load simulator can also be used in plasma processing apparatuses having different inter-electrode distances.

Other features and advantages of the present invention will become apparent from the detailed description given below with reference to the attached drawings.

DETAILED DESCRIPTION OF THE PREFERRED EMBODIMENTS

A specific description of an embodiment of the present invention will be given below with reference to the attached drawings.

FIGS. 1 to 5 are diagrams for describing a load simulator based on an embodiment of the present invention.

Figure 2:
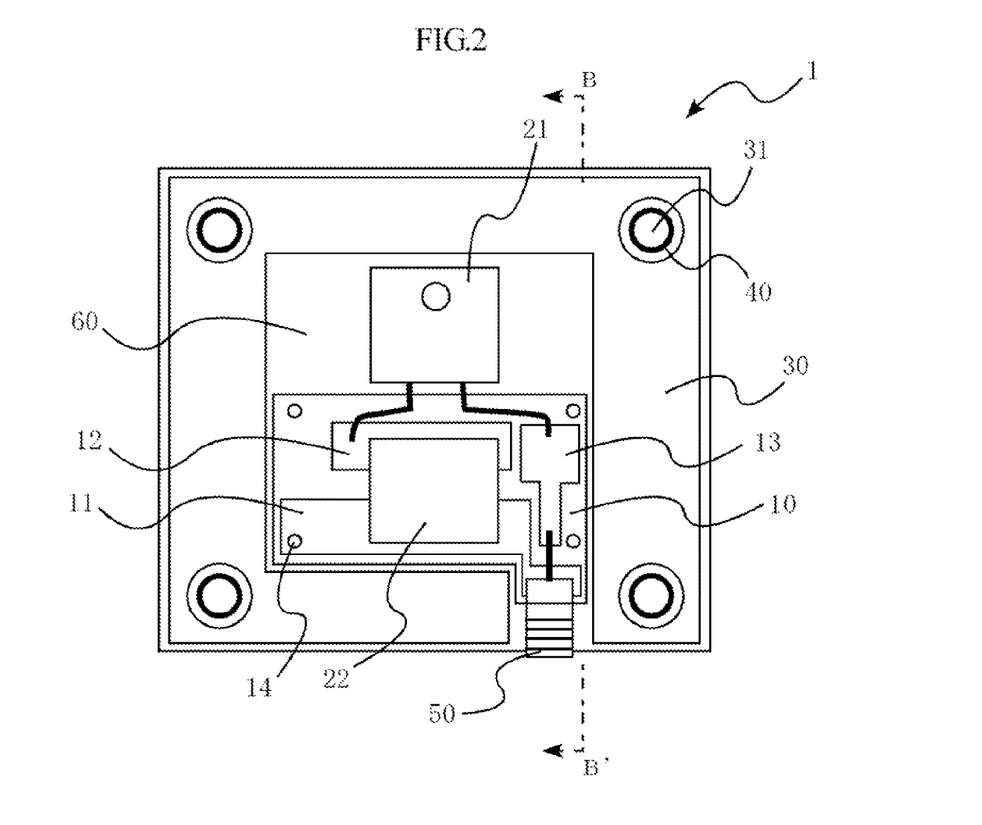
FIG. 2 is a plan view of the configuration of the load simulator of the present invention.

As shown in FIG. 2, a load simulator 1 includes passive elements such as a resistor 21 and a capacitor 22. The impedance of the load simulator 1 is set to a predetermined value. The load simulator 1 can therefore be used to simulate a load having that impedance value.

Figure 1:
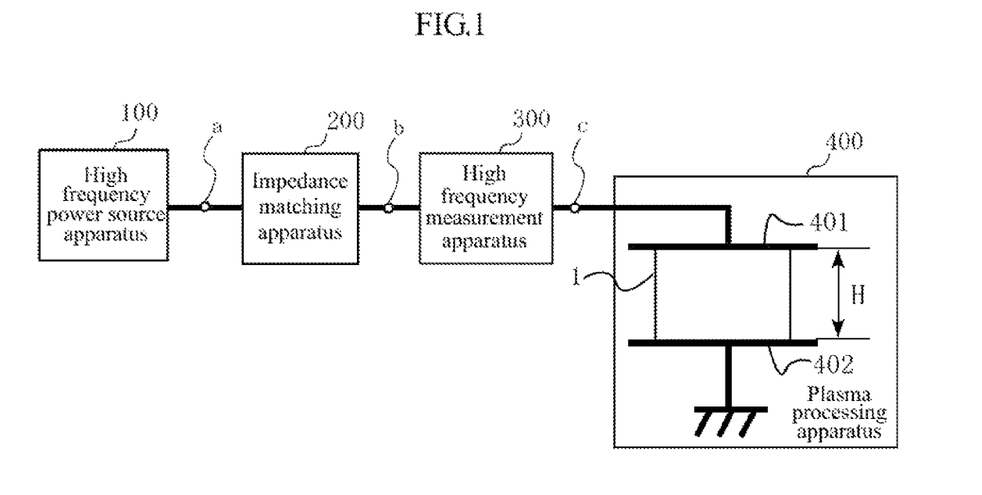
FIG. 1 is a diagram illustrating the case of using a load simulator according to the present invention in processing for calibrating a high, frequency measurement apparatus.

As shown in FIG. 1, the chamber of a plasma processing apparatus 400 is provided with two electrodes, namely a positive electrode 401 and a ground electrode 402. The load simulator 1 is disposed between these two electrodes, and is used to calibrate a high frequency measurement apparatus 300. The high frequency measurement apparatus 300 is connected to an input terminal c of the plasma processing apparatus 400, and a calibration parameter is calculated based on a measured impedance value obtained by the high frequency measurement apparatus 300 and the real impedance value set in the load simulator 1. A method for calculating the calibration parameter will be described later.

Figure 3:
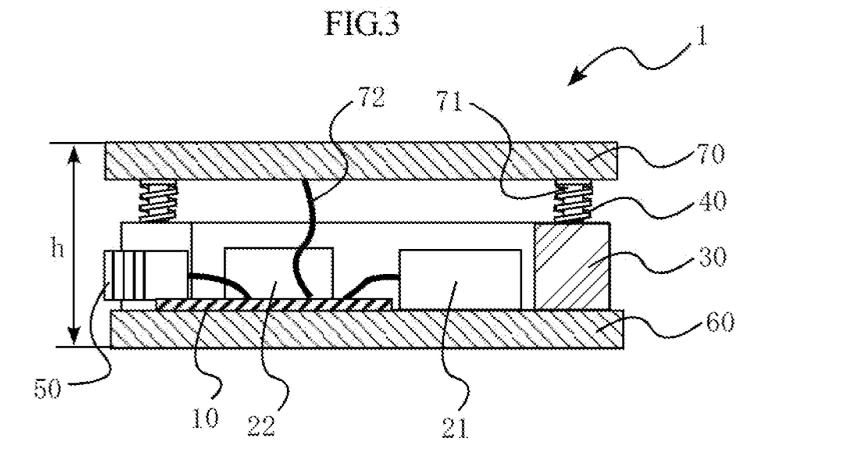
FIG. 3 is a cross-sectional view taken along line B-B' shown in FIG. 2.
Figure 4:
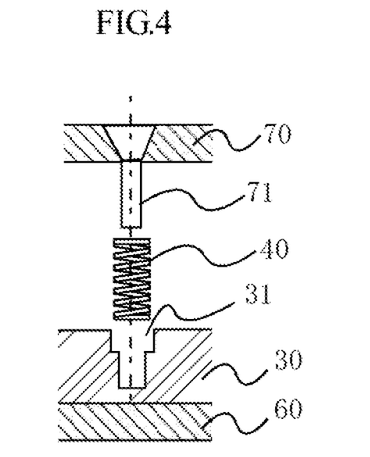
FIG. 4 is a diagram illustrating the structure of a coil spring portion of the load simulator according to the present invention.

FIG. 2 is a plan view of the load simulator 1. A positive electrode plate 70, which will be described later, is not shown in FIG. 2. FIG. 3 is a cross-sectional view of the load simulator 1 taken along line B-B' shown in FIG. 2. FIG. 4 is a diagram for describing the structure of a coil spring 40 portion of the load simulator 1.

As shown in FIGS. 2 and 3, the load simulator 1 includes a printed circuit board 10, the resistor 21, the capacitor 22, insulating resin 30, four coil springs 40, a coaxial connector 50, a ground electrode plate 60, and the positive electrode plate 70.

The printed circuit board 10 is obtained by forming predetermined wiring on a substantially rectangular substrate made up of an insulating material such as glass epoxy, and passive elements such as the resistor 21 and the capacitor 22 are mounted on the printed circuit board 10. As shown in FIG. 2, the printed circuit board 10 is provided with ground wiring 11, connection wiring 12, and positive-side wiring 13.

The ground wiring 11 electrically connects a first terminal of the capacitor 22 and a negative-side terminal of the coaxial connector 50. The printed circuit board 10 is fixed to the ground electrode plate 60 using four screws 14. The screws 14 are electrically conductive, and one of them is fixed to the ground electrode plate 60 above the ground wiring 11. The ground wiring 11 and the ground electrode plate 60 are therefore electrically connected via that screw 14. The ground electrode plate 60 is electrically connected to the ground electrode 402 when the load simulator 1 is disposed in the plasma processing apparatus 400 (see FIG. 1). The ground electrode 402 is grounded and is at the reference potential (ground potential) of 0 V. The potential of the ground wiring 11 is therefore also the reference potential. Note that in the case where the printed circuit board 10 is not fixed to the ground electrode plate 60 using the screw 14, the ground wiring 11 and the ground electrode plate 60 may be electrically connected via through-holes (holes penetrating the substrate that have been subjected to plating or the like in order to electrically connect the two surfaces of the substrate) provided in the printed circuit board 10. Also, another method may be used to electrically connect the ground wiring 11 and the ground electrode plate 60.

The connection wiring 12 electrically connects a first terminal of the resistor 21 and a second terminal of the capacitor 22. The resistor 21 and the capacitor 22 are therefore connected to each other in series.

The positive-side wiring 13 electrically connects a second terminal of the resistor 21 and a positive-side terminal of the coaxial connector 50. The positive-side wiring 13 and the positive electrode plate 70 are electrically connected via a connection conductor 72 that will be described later. The positive electrode plate 70 is electrically connected to the positive electrode 401 when the load simulator 1 is disposed in the plasma processing apparatus 400. The high frequency power supplied to the positive electrode 401 of the plasma processing apparatus 400 is therefore supplied to the positive-side wiring 13.

Note that the configuration of the printed circuit board 10 is not limited to this. For example, the shape of the printed circuit board 10 is not limited to being rectangular, and there are also no limitations on the disposition of the resistor 21 and the capacitor 22, as well as the shapes of the various wiring.

The resistor 21 has a resistance value of approximately 50Ω. The resistance value of the resistor 21 is set such that the overall resistance value of the load simulator resistance value 1 is 50Ω, including parasitic resistance resulting from the various wiring and the like. The resistor 21 is fixed to the ground electrode plate 60 so as to be in direct contact therewith. Heat generated by the resistor 21 can therefore be efficiently dissipated by the ground electrode plate 60. Note that in the case where there is no need to dissipate heat generated by the resistor 21, the resistor 21 does not need to be fixed to the ground electrode plate 60. For example, the resistor 21 may be fixed to the printed circuit board 10.

The capacitor 22 is a passive element that has a predetermined capacitance. The capacitance of the capacitor 22 is capacitance for canceling out parasitic inductance resulting from the various wiring and the like, and is set such that the overall reactance of the load simulator 1 is j0Ω (j being an imaginary unit) when high frequency power is supplied from the high frequency power source apparatus 100 (see FIG. 1).

Figure 5:
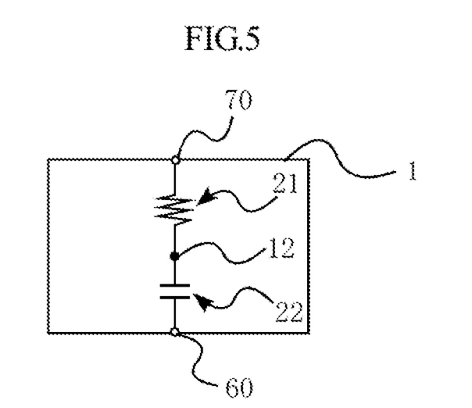
FIG. 5 is a circuit diagram showing the load simulator of the present invention.

FIG. 5 is a circuit diagram showing the load simulator 1. As shown in FIG. 5, the resistor 21, and the capacitor 22 are connected in series by the connection wiring 12 between the positive electrode plate 70 and the ground electrode plate 60.

The load simulator 1 is designed such that the overall impedance is 50+j0Ω. Three load simulators are used in the later-described calibration of the high frequency measurement apparatus 300. The load simulator 1 is a load simulator having the characteristic impedance (50±j0Ω), and will be referred to as the load simulator 1a when there is a need to distinguish between the three load simulators in the description. Also, a load simulator 1b is a load simulator having the open condition impedance (substantially infinite), and a load simulator 1c is a load simulator having the short circuit condition impedance (substantially zero). The configurations of the load simulators 1b and 1c are similar to the configuration of the load simulator 1a, but the resistance value of the resistor 21 and the capacitance of the capacitor 22 are different from those in the case of the load simulator 1a. Note that it is sufficient that the resistance value of the resistor 21 and the capacitance of the capacitor 22 in the load simulators 1b and 1c are designed appropriately.

It should also be noted that the passive elements used in the load simulators 1a, 1b, and 1c are not limited to being the resistor 21 and the capacitor 22. An inductor may be used instead of the capacitor 22, or inductors may be used instead of the resistor 21 and the capacitor 22. Also, there is no limitation to the case where the passive elements are connected to each other in series, and they may be connected to each other in parallel. It is sufficient that the arrangement of the passive elements and the method for connecting them are designed appropriately such that the load simulators 1a to 1c can artificially realize loads having predetermined impedances.

The insulating resin 30 is for insulating the positive electrode plate 70 and the ground electrode plate 60 so that a short circuit does not occur. In the present embodiment, polytetrafluoroethylene (commercial name "Teflon") is used as the material of the insulating resin 30. Note that the material of the insulating resin 30 needs only be a material having insulating properties, and may be another synthetic resin or the like. As shown in FIG. 2, the insulating resin 30 is configured as an enclosure made up of four linear portions, and is shaped such that a portion is missing from the enclosure. Note that the shape of the insulating resin 30 is not limited to this. A configuration is possible in which the shape of the insulating resin 30 is not missing a portion (i.e., a fully closed rectangular shape in a plan view), and a hole for the disposition of the coaxial connector 50 is provided in a portion of the insulating resin 30. Also, the insulating resin 30 may be annular in a plan view, or a configuration is possible in which the outer shape is rectangular and the inner shape is circular in a plan view. Furthermore, the insulating resin 30 may be box-shaped in which the upper face side in FIG. 3 is closed.

As shown in FIGS. 2 and 3, the insulating resin 30 is fixed to the ground electrode plate 60 such that the outer circumference extends along the outer circumference of the ground electrode plate 60. The printed circuit board 10, the resistor 21, and the capacitor 22 are disposed in a hollow portion in the center in a plan view. Accordingly, the printed circuit board 10, the resistor 21, and the capacitor 22 are surrounded by the insulating resin 30. If the printed circuit board 10, the resistor 21, and the capacitor 22 are not surrounded by the insulating resin 30, when the load simulator 1 is disposed in the plasma processing apparatus 400, there are cases where a floating capacitance is generated between the various wiring on the printed circuit board 10 and the walls of the chamber of the plasma processing apparatus 400. The impedance changes if a floating capacitance is generated. The impedance of the load simulator 1 would therefore be different before and after being disposed in the plasma processing apparatus 400. The insulating resin 30 also has the function of suppressing the generation of such a floating capacitance so as to suppress a change in the impedance of the load simulator 1.

Also, a hole 31 is provided at each of the four corners of the upper face of the insulating resin 30. A coil spring 40 is inserted into each of the holes 31 (see FIG. 4). The insulating resin 30 also serves the role of fixing the coil springs 40. Note that the number of holes 31 that are provided is not limited to being four.

The configuration of the insulating resin 30 is not limited to this. If the floating capacitance that is generated when the load simulator 1 is disposed in the plasma processing apparatus 400 can be ignored, there is no need to cover the printed circuit board 10 and the like with the insulating resin 30. For example, instead of providing the insulating resin 30, columns of an insulator may be provided at the four corners of the ground electrode plate 60. Also, a column of an insulator may be provided in the center of the ground electrode plate 60, and the printed circuit board 10 and the like may be provided around the column.

The coil springs 40 are for biasing the positive electrode plate 70 and the ground electrode plate 60 in the direction of separation from each other using elastic force. When the load simulator 1 is disposed in the plasma processing apparatus 400, the elastic force of the coil springs 40 presses the positive electrode plate 70 against the positive electrode 401, and presses the ground electrode plate 60 against the ground, electrode 402 (see FIGS. 1 and 3). Note that another elastic body may be used instead of the coil springs 40. It is sufficient that the positive electrode plate 70 and the ground electrode plate 60 are biased in the direction of separation from each other using elastic force, and therefore a configuration is possible in which plate springs, rubber, or the like are used.

Also, there is no need for a biasing configuration such as the coil springs 40 if a distance H between the positive electrode 401 and the ground electrode 402 of the plasma processing apparatus 400 (hereinafter, referred to as the "inter-electrode distance"; see FIG. 1) matches a height h of the load simulator 1 (the distance between the upper face of the positive electrode plate 70 and the lower face of the ground electrode plate 60; see FIG. 3). Accordingly, the load simulator 1 may be designed such that the height h and the inter-electrode distance H match each other, or a configuration for adjusting the height h may be provided. Note that there are cases where the inter-electrode distance H differs for each plasma processing apparatus 400. Also, if the positive electrode 401 is disposed on the lid of the chamber, there are cases where the inter-electrode distance H changes due to the opening and closing of the lid. In consideration of this, it is desirable that the load simulator 1 is provided with a bias applier such as the coil springs 40.

The coaxial connector 50 is used when the impedance of the load simulator 1 is measured using an impedance analyzer. The load simulator 1 is designed so as to have a predetermined impedance value. Specifically, selection of the passive elements and adjustment of the various wiring are performed while measuring the impedance, such that the measured impedance arrives at a target impedance value. When the impedance is to be measured, the connector of the measurement terminal of the impedance analyzer is connected to the coaxial connector 50. Note that there is no need to provide the coaxial connector 50 if the impedance is measured using another method.

The ground electrode plate 60 is for electrical connection to the ground electrode 402 when the load simulator 1 is disposed in the plasma processing apparatus 400. The ground electrode plate 60 is a rectangular copper plate that is electrically conductive and thermally conductive. In the present embodiment, the ground electrode plate 60 also functions as a heat dissipating plate and dissipates heat generated by the resistor 21 fixed to the ground electrode plate 60. When the load simulator 1 is disposed in the plasma processing apparatus 400, the ground electrode plate 60 is pressed against the ground electrode 402 by the coil springs 40. The ground electrode plate 60 and the ground electrode 402 are therefore in close contact, thus enabling the potential of the ground electrode plate 60 to be set to the reference (ground) potential. Note that the shape of the ground electrode plate 60 is not limited to this. For example, the ground electrode plate 60 may be shaped so as to conform to the shape of the ground electrode 402 of the plasma processing apparatus 400. Also, the material of the ground electrode plate 60 is not limited to being copper, and needs only be an electrically conductive material.

The positive electrode plate 70 is for electrical connection to the positive electrode 401 when the load simulator 1 is disposed in the plasma processing apparatus 400. In the present embodiment, the positive electrode plate 70 is a copper plate with a shape similar to that of the ground electrode plate 60. When the load simulator 1 is disposed in the plasma processing apparatus 400, the positive electrode plate 70 is pressed against the positive electrode 401 by the coil springs 40. The positive electrode plate 70 and the positive electrode 401 are therefore in close contact, thus enabling high frequency power input from the high frequency power source apparatus 100 to the plasma processing apparatus 400 to be appropriately supplied to the load simulator 1. Note that the shape of the positive electrode plate 70 is not limited to this. For example, the positive electrode plate 70 may be shaped so as to conform to the shape of the positive electrode 401 of the plasma processing apparatus 400. Also, the material of the positive electrode plate 70 is not limited to being copper, and needs only be an electrically conductive material.

The position of the positive electrode plate 70 relative to the ground electrode plate 60 is defined by guides 71 (see FIGS. 3 and 4). In the present embodiment, screws are screwed into holes provided at the four corners of the positive electrode plate 70, and the portions of the screws that project out from the lower face of the positive electrode plate 70 (the bottom face in FIG. 3) serve as the guides 71. The guides 71 are provided so as to conform to the positions of the holes 31 at the four corners of the upper face of the insulating resin 30. The four guides 71 are inserted into the coil springs 40 and holes 31 (see FIG. 4) such that the positive electrode plate 70 is disposed substantially parallel to the ground electrode plate 60 over the insulating resin 30 ("over" as viewed in FIGS. 3 and 4). The guides 71 restrict change in the horizontal position (position in the up-down and left-right directions in FIG. 2) of the positive electrode plate 70 relative to the ground electrode plate 60. Note that the coil springs 40 may be fixed to the positive electrode plate 70 instead of providing the guides 71.

Also, the positive electrode plate 70 is electrically connected to the positive-side wiring 13 by the connection conductor 72 (see FIG. 3). Since the distance between the positive electrode plate 70 and the ground electrode plate 60 can change due to the coil springs 40, the distance between the positive electrode plate 70 and the printed circuit board 10 fixed to the ground electrode plate 60 also changes. A flexible conductor is therefore used as the connection conductor 72. In the present embodiment, copper foil that has been processed so as to be able to be employed as the connection conductor 72 is used. For example, it is sufficient for the connection conductor 72 to be a conductor formed by preparing copper foil tape by applying an electrically conductive adhesive to one face of elongated copper foil, and then folding the copper foil tape such that the face to which the electrically conductive adhesive was applied is on the inner side. Note that since the distance between the printed circuit board 10 and the positive electrode plate 70 changes as described above, it is sufficient that the length and shape of the connection conductor 72 are designed taking this fact into consideration.

Also, the connection conductor 72 is not limited to this, and needs only be a member obtained by processing an electrically conductive material so as to be flexible. For example, a copper wire or the like may be used. Note that the resistance value of the connection conductor 72 rises as the cross-sectional area of the connection conductor 72 decreases and the length thereof increases. It is therefore preferable that the connection conductor 72 has a larger cross-sectional area and a shorter length. Also, a configuration is possible in which, instead of providing the connection conductor 72, the coil springs 40 are formed using an electrically conductive material, one end of each coil spring 40 is fixed to the positive electrode plate 70, and the other end is connected to the positive-side wiring 13.

The height of the load simulator 1 can change due to the coil springs 40. Specifically, the height of the load simulator 1 changes in the range between the height h when pressure is not applied to the load simulator 1 (only gravity due to the positive electrode plate 70 is in effect) and the height when the lower face of the positive electrode plate 70 comes into contact with the upper face of the insulating resin 30 (hereinafter, referred to as the height h'). The load simulator 1 therefore can be used with any plasma processing apparatus 400 as long as the inter-electrode distance H falls within this range of change (h'<H<h). Also, it is sufficient that the load simulator 1 is designed such that the height of the insulating resin 30 (vertical dimension in FIG. 3), the length of the coil springs 40, and the like are adjusted according to the inter-electrode distances H of the plasma processing apparatuses 400 with which the load simulator 1 will possibly be used.

It is sufficient that the horizontal size of the load simulator 1 (in FIG. 2, the size in the up-down direction and the size in the left-right direction), that is to say, the size of the positive electrode plate 70 and the ground electrode plate 60, is designed according to the size of the electrodes 401 and 402 of the plasma processing apparatus 400 with which the load simulator 1 will be used. For example, the positive electrode plate 70 and the ground electrode plate 60 may be formed smaller than the electrodes 401 and 402 as shown in FIG. 1.

Next, a method for calibrating the high frequency measurement apparatus 300 using the load simulators 1a, 1b, and 1c will be described.

The high frequency measurement apparatus 300 is a so-called RF sensor that measures high frequency parameters for the impedance, reflection coefficient, high frequency voltage, high frequency current, traveling wave power, reflected wave power, and the like in the chamber of the plasma processing apparatus 400 in order to monitor the state of the plasma processing apparatus 400 during plasma processing. As shown in FIG. 1, the high frequency measurement apparatus 300 is disposed at the input terminal of the plasma processing apparatus 400. The high frequency measurement apparatus 300 detects the high frequency voltage and the high frequency current at the input terminal of the plasma processing apparatus 400 using a sensor, and calculates high frequency parameters for the impedance and the like from the detected values using an arithmetic operation. Note that a detailed description of the high frequency measurement apparatus 300 will not be given.

In the calibration of the high frequency measurement apparatus 300, first the load simulators 1a, 1b, and 1c are disposed between the electrodes 401 and 402 of the plasma processing apparatus 400 in the stated order, and the impedance of each load simulator is measured by the high frequency measurement apparatus 300. The load simulators 1a, 1b, and 1s are designed so as to each have a predetermined impedance. Next, a calibration parameter for correcting the high frequency voltage and the high frequency current is calculated from the measured impedance values of the load simulators 1a, 1b, and 1c that were obtained by the high frequency measurement apparatus 300 and the real impedance values of the load simulators 1a, 1b, and 1c. In the actual measurement performed by the high frequency measurement apparatus 300, the detected high frequency voltages and high frequency currents are corrected using the calibration parameter before various types of high frequency parameters are calculated.

Figure 6:
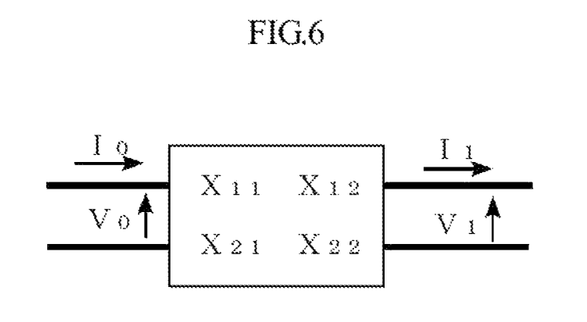
FIG. 6 is a diagram for describing a calibration parameter.

If the relationship that a current signal $I_0$ and a voltage signal $V_0$ detected and output by the high frequency measurement apparatus 300 have with a current signal $I_1$ flowing between the electrodes of the plasma processing apparatus 400 and a voltage signal $V_1$ generated between the electrodes is replaced with a two-port network, a calibration parameter X for correcting the current signal $I_0$ and the voltage signal $V_0$ to the current signal $I_1$ and the voltage signal $V_1$ can be thought of as the two-dimensional square matrix shown in FIG. 6.

Elements $X_{11}, X_{12}, X_{21}$, and $X_{22}$ of the calibration parameter X can be calculated from the real impedance values of the load simulators 1a, 1b, and 1c, and the measured impedance values of the load simulators 1a, 1b, and 1c that were obtained by the high frequency measurement apparatus 300. Note that the absolute values of a voltage value and a current value that are to serve as a reference are needed in order to perform this calculation. Highly precise measured power values are necessary in order to use the absolute values of a voltage value and a current value as reference values. In order to measure highly precise measured power values, it is best to connect a load for which the reflected power is "0" when performing measurement. Accordingly, in order to realize a reflected power of "0" in the present embodiment, the load simulator 1a that is used is a load having the same impedance as the characteristic impedance (i.e., 50+j0Ω).

The calculated calibration, parameter X can be used to convert the current signal $I_0$ and voltage signal $V_0$ into the corrected current signal $I_1$ and voltage signal $V_1$ as shown in FIG. 6. Specifically, the corrected current signal $I_1$ and voltage signal $V_1$ can be calculated using the following Expressions (1) and (2) that are derived from FIG. 6.

$$\begin{bmatrix} V_0 \\ V_1 \end{bmatrix} = \begin{bmatrix} X_{11} & X_{12} \\ X_{21} & X_{22} \end{bmatrix} \begin{bmatrix} I_0 \\ I_1 \end{bmatrix}$$

$$V_0 = X_{11} \cdot I_0 - X_{12} \cdot I_1$$

$$V_1 = X_{21} \cdot I_0 - X_{22} \cdot I_1$$

$$I_1 = \frac{X_{11}}{X_{12}} \cdot I_0 - \frac{1}{X_{12}} \cdot V_0 \quad (1)$$

$$V_1 = \frac{(X_{12} \cdot X_{21} - X_{11} \cdot X_{22})}{X_{12}} \cdot I_0 + \frac{X_{22}}{X_{12}} \cdot V_0 \quad (2)$$

Next, a description of a procedure for calibrating the high frequency measurement apparatus 300 will be given with reference to the flowchart shown in FIG. 7.

Figure 7:
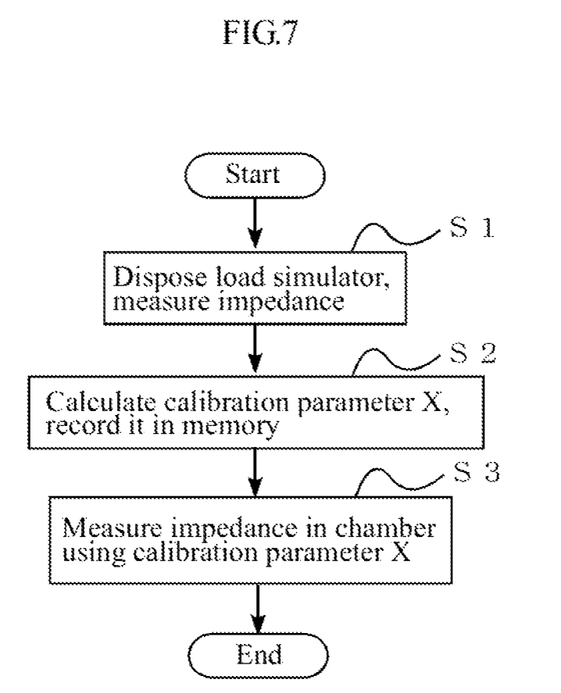
FIG. 7 is a flowchart showing a procedure of calibration of the high frequency measurement apparatus.

FIG. 7 is a flowchart for describing a procedure for calibrating the high frequency measurement apparatus 300. This flowchart shows a procedure of processing for correcting the current signal $I_0$ and voltage signal $V_0$ that are detected in the case where the impedance between the electrodes in the chamber of the plasma processing apparatus 400 is measured by the high frequency measurement apparatus 300.

First, the load simulators 1a, 1b, and 1c are disposed between the electrodes 401 and 402 of the plasma processing apparatus 400 in the stated order (see FIG. 1), and the impedances thereof are measured by the high frequency measurement apparatus 300 (step S1). Next, the calibration parameter X is calculated from the measured impedance values of the load simulators 1a, 1b, and 1c that were obtained by the high frequency measurement apparatus 300 and the real impedance values of the load simulators 1a, 1b, and 1c, and the calibration parameter X is recorded in a memory of the high frequency measurement apparatus 300 (step S2). In the present embodiment, an arithmetic circuit (not shown) of the high frequency measurement apparatus 300 records the measured impedance values of the load simulators 1a, 1b, and 1c in the memory, and after the three measured impedance values have been obtained, the arithmetic circuit calculates the elements of the calibration parameter X using the real impedance values of the load simulators 1a, 1b, and 1c that were recorded in advance, and records the elements of the calibration X in the memory. Note that there is no limitation to the case where an arithmetic circuit of the high frequency measurement apparatus 300 performs the calculation of the calibration parameter X, and a configuration is possible in which, for example, the calibration parameter X is calculated separately by a worker. In this case, it is sufficient that the worker inputs the calibration parameter X using an input device of the high frequency measurement apparatus 300 in order for the calibration parameter X to be recorded in the memory.

Next, the impedance between the electrodes in the chamber of the plasma processing apparatus 400 is measured when plasma processing is actually being performed (step S3). At this time, the high frequency measurement apparatus 300 corrects the detected current signal $I_0$ and voltage signal $V_0$ using the calibration parameter X recorded in the memory, and calculates the impedance based on the corrected current signal $I_1$ and voltage signal $V_1$.

Note that the above-described calibration processing procedure is a processing procedure in the case where the calibration parameter X has not been recorded in the memory of the high frequency measurement apparatus 300. Steps S1 and S2 of the above processing procedure do not need to be performed every time, and it is sufficient that the calibration parameter X is recorded after performing these steps one time. This processing may be performed by the manufacturer when manufacturing the high frequency measurement apparatus 300.

According to the present embodiment, the positive electrode plate 70 and the ground electrode plate 60 of the load simulator 1 are disposed so as to be parallel to each other. Accordingly, the load simulator 1 is disposed between the positive electrode 401 and the ground electrode 402 of the plasma processing apparatus 400 such that the positive electrode plate 70 is connected to the positive electrode 401 of the plasma processing apparatus 400, and the ground electrode plate 60 is connected to the ground electrode 402. Accordingly, in the calibration of the high frequency measurement apparatus 300, the load simulator 1 can be disposed between the two electrodes 401 and 402 of the plasma processing apparatus 400, and the impedance thereof can be measured by the high frequency measurement apparatus 300. The calibration parameter X is then calculated from the measured value and the real impedance value of the load simulator 1. The calibration parameter X can be used to correct a detected value obtained by the high frequency measurement apparatus 300 to the value between the electrodes in the chamber of the plasma processing apparatus 400. Using this calibration parameter X therefore enables raising the precision of measured values obtained by the high frequency measurement apparatus 300 compared to the case of using a calibration parameter that is based on a measured impedance value obtained by directly connecting the load simulator 500 to the high frequency measurement apparatus 300.

Also, when the load simulator 1 is disposed in the plasma processing apparatus 400, the positive electrode plate 70 and the ground electrode plate 60 of the load simulator 1 are respectively pressed against the positive electrode 401 and the ground electrode 402 of the plasma processing apparatus 400 by the coil springs 40. This enables bringing the positive electrode plate 70 and the positive electrode 401 into close contact, and bringing the ground electrode plate 60 and the ground electrode 402 into close contact. Also, since the height h of the load simulator 1 can change, it can be disposed in any plasma processing apparatus 400 in which the inter-electrode distance H is in a predetermined range.

Note that although the case of performing calibration using the three load simulators 1a, 1b, and 1c is described in the above embodiment, the present invention is not limited to this. A configuration is possible in which switching between three types of impedances is made possible by providing a variable resistor and a variable capacitor as the resistor 21 and the capacitor 22 of the load simulator 1. In this case, loads having various impedances can be realized through the switching of the impedance, without the load simulator 1 being removed from the chamber and exchanged.

In the above embodiment, the case is described in which the impedances of the load simulators 1a, 1b, and 1c are set to an impedance value close to limit values so as to enable performing calibration with a wide range of impedances, but the present invention is not limited to this. The impedances of the load simulators 1a, 1b, and 1c may be set in accordance with the range of impedances to be measured by the high frequency measurement apparatus 300.

Although the case where the positive electrode 401 and the ground electrode 402 of the plasma processing apparatus 400 are parallel plate electrodes is described in the above embodiment, the present invention is not limited to this. In the case where the positive electrode 401 or the ground electrode 402 is not a flat plate, or the case where the positive electrode 401 and the ground electrode 402 are not parallel with each other, it is sufficient to change the shape and manner of fixing the positive electrode plate 70 or the ground electrode plate 60. For example, if the positive electrode 401 is a curved plate instead of a flat plate, it is sufficient to form the face of the positive electrode plate 70 that opposes the positive electrode 401 so as to be a similar curved face.

The invention claimed is:

1. A load simulator comprising:
   two electrode plates movable relative to each other;
   a passive element that functions as a simulated load, provided independently of the two electrode plates and electrically connected to the two electrode plates;
   a bias applier that biases at least one of the two electrode plates in a predetermined direction;
   a circuit having wiring that connects the passive element and the two electrode plates; and
   an insulator supported by one of the two electrode plates;
   wherein the passive element and the circuit are disposed between the two electrode plates, and the insulator is disposed so as to surround the circuit and configured to extend from said one of the two electrode plates toward the other one of the two electrode plates so as to exceed a height of the passive element in the predetermined direction, and
   wherein the bias applier biases the two electrode plates so as to respectively be brought into direct contact with and pressed against two electrodes in a chamber of a plasma processing apparatus.

2. The load simulator according to claim 1, wherein the two electrode plates are substantially parallel with each other, and the bias applier biases the two electrode plates in a direction of separation from each other.

3. The load simulator according to claim 1, wherein the bias applier comprises a coil spring disposed between the two electrode plates.

4. The load simulator according to claim 1, wherein the two electrode plates are each a copper plate.

5. The load simulator according to claim 1, further comprising a flexible conductor for electrically connecting the passive element and at least one of the two electrode plates.

6. The load simulator according to claim 5, wherein the conductor is copper foil.

7. The load simulator according to claim 1, further comprising a coaxial connector electrically connected to the two electrode plates.

8. The load simulator according to claim 1, wherein the bias applier is held in direct contact with the insulator.

9. The load simulator according to claim 1, wherein an entirety of the insulator is disposed between the two electrode plates.

* * * * *